United States Patent
Furukawa et al.

[11] Patent Number: 5,930,656
[45] Date of Patent: Jul. 27, 1999

[54] METHOD OF FABRICATING A COMPOUND SEMICONDUCTOR DEVICE

[75] Inventors: Chisato Furukawa; Masayuki Ishikawa; Hideto Sugawara; Kenji Isomoto, all of Tokyo, Japan

[73] Assignee: Kabushiki Kaisha Toshiba, Kawasaki, Japan

[21] Appl. No.: 08/953,639

[22] Filed: Oct. 17, 1997

[30] Foreign Application Priority Data

Oct. 21, 1996 [JP] Japan ................... P8-278011

[51] Int. Cl.$^6$ .......... H01L 21/205; H01L 33/00; H01L 21/31

[52] U.S. Cl. .......... 438/479; 438/507; 438/779; 438/783; 438/784; 438/913; 438/930; 438/958; 438/94; 438/47

[58] Field of Search ................... 438/907, 913, 438/908, 93, 94, 479, 930, 779, 958, FOR 264, FOR 267, FOR 286, FOR 287, FOR 293, FOR 395, FOR 396, FOR 415, FOR 416, 783, 784, 46, 47, 507

[56] References Cited

U.S. PATENT DOCUMENTS

| | | |
|---|---|---|
| 3,625,749 | 12/1971 | Yoshioka et al. . |
| 4,436,770 | 3/1984 | Nishizawa et al. . |
| 4,477,311 | 10/1984 | Mimura et al. . |
| 4,871,692 | 10/1989 | Lee et al. . |
| 4,933,299 | 6/1990 | Durose . |
| 4,987,008 | 1/1991 | Yamazaki et al. . |
| 5,346,581 | 9/1994 | Tsang . |
| 5,407,531 | 4/1995 | Chiu et al. . |
| 5,733,796 | 3/1998 | Manabe et al. . |
| 5,821,171 | 10/1998 | Hong et al. . |

*Primary Examiner*—Mary Wilczewski
*Attorney, Agent, or Firm*—Finnegan, Henderson, Farabow, Garrett & Dunner, L.L.P.

[57] ABSTRACT

A substrate for forming a compound semiconductor device is placed in a reaction chamber. An MOCVD method or a GS-MBE method is used to grow compound semiconductor layers on the substrate. The grown layers include, for example, a GaN buffer layer, an n-GaN layer, an InGaN active layer, a p-AlGaN layer, and a p$^+$-GaN contact layer. After the growth of the layers, the substrate is kept in the reaction chamber, and a passivation film of, for example, SiNx, SiO2, or SiON is formed on top of the grown layers according to a CVD or GS-MBE method. Since the top of the grown layers is not exposed to air outside the reaction chamber, no oxidization or contamination occurs on the top of the grown layers. The compound semiconductor device is manufactured through simpler processes compared with a prior art that needs separate apparatuses for growing and forming the layers and passivation film.

7 Claims, 7 Drawing Sheets

METHOD OF FABRICATING A COMPOUND SEMICONDUCTOR DEVICE

BACKGROUND OF THE INVENTION

1. Field of the Invention

The present invention relates to a compound semiconductor device and a method of manufacturing the same, and particularly, to a compound semiconductor device involving a small number of processes to efficiently protect the top of layers grown thereon and a method of manufacturing such a compound semiconductor device.

2. Description of the Related Art

Various types of compound semiconductor devices have been actively developed FIG. 6 is a sectional view showing a blue light emitting diode as an example of a gallium-nitride-based compound semiconductor device. This device is composed of a sapphire substrate 101 and layers grown thereon. The layers include a GaN buffer layer 103, an n-GaN layer 105, an InGaN active layer 107, a p-AlGaN layer 109, and a p$^+$-GaN contact layer 111.

The top layer 111 is covered with a passivation film 113, which is an insulating or dielectric thin film made of, for example, SiO$_2$ or SiNx.

A method of manufacturing the device of FIG. 6 will be explained. Firstly, the sapphire substrate is set in a reaction chamber of an MOCVD (metal organic chemical vapor deposition) apparatus. In the reaction chamber, the layers 103 to 111 are epitaxially grown on the substrate. The substrate 101 with the layers 103 to 111 is cooled in the reaction chamber with a carrier gas and a V-group gas such as an ammonia gas being supplied to the reaction chamber. After the substrate 101 is sufficiently cooled, it is taken out of the reaction chamber.

The top of the layers 103 to 111 is lightly etched, and the substrate 101 with the layers is transferred into a separate thermal or plasma CVD apparatus in which the passivation film 113 is formed on the top layer 111.

If the separate apparatus is a thermal CVD apparatus and the passivation film 113 includes SiO$_2$, the substrate 101 is heated in the apparatus to a temperature in the range of 350° C. to 500° C. to form the thin film 113. If the apparatus is the same and the thin film 113 includes SiNx, the substrate 101 is heated in the apparatus to a temperature in the range of 800° C. to 1200° C. to form the thin film 113. If the separate apparatus is a plasma CVD (P-CVD) apparatus, the substrate 101 is heated to a temperature in the range of 100° C. to 300° C. in a vacuum formed in the apparatus.

After the formation of the passivation film 113, the substrate 101 with the layers 103 to 111 and thin film 113 (collectively referred to as the product) is cooled in the apparatus. When the product is sufficiently cooled, it is taken out of the apparatus. The product is then transferred to an annealing apparatus, which anneals the product in a nitrogen atmosphere, to further activate p-type impurities added among the grown layers and realize good p-type conductivity.

The passivation film 113 mainly functions to protect the top of the layers 103 to 111 against oxidization, contamination, flaws, etc. In III-V-group compound semiconductor in particular, V-group elements have a high vapor pressure to cause an escape of As from GaAs-based material, an escape of P from InP-based material, an escape of N from GaN-based material, and an evaporation of the V-group elements. The thin film 113 prevents such escape and evaporation.

The conventional manufacturing method, however, must employ separate apparatuses to epitaxially grow the layers 103 to 111 and form the passivation film 113. When the substrate is transferred from the MOCVD apparatus to the thermal CVD apparatus after the growth of the layers 103 to 111, the top of these layers is exposed to open air and is oxidized thereby. If the top of the layers contains material such as Al that is easily oxidized or nitrided, the oxidization or nitriding starts as soon as the substrate is taken out of the apparatus. The oxidization and nitriding cause defects to deteriorate the reliability of the compound semiconductor device thus formed.

To solve this problem, the top of the layers 103 to 111 is lightly etched before the formation of the passivation film 113, as mentioned above. This etching, however, may adversely roughen and contaminate the top of the layers.

When forming the passivation film 113, the substrate with the grown layers must be set in a separate apparatus and must be heated to a predetermined temperature. During the heating process, the top of the grown layers is bare, and therefore, V-group elements may escape therefrom. In particular, when the heating process is carried out in a vacuum, a vapor pressure increases to easily make V-group elements escape and cause crystal defects.

SUMMARY OF THE INVENTION

An object of the present invention is to provide a compound semiconductor device having grown layers whose top is clean and involves no crystal defects.

Another object of the present invention is to provide a method of simply manufacturing a compound semiconductor device having grown layers whose top is clean and involves no crystal defects.

In order to accomplish the objects, the present invention provides a compound semiconductor device having a substrate, a plurality of layers grown on the substrate, and a passivation film formed on top of the grown layers. The passivation film is a dielectric or insulating thin film. The grown layers and passivation film are continuously formed in the same reaction chamber.

This compound semiconductor device has no defects from oxidization, contamination, or an escape of V-group elements in the top of the grown layers.

The present invention also provides a method of manufacturing a compound semiconductor device, including the steps of growing a plurality of layers on a substrate and forming a passivation film on the grown layers. The growth of the layers and the formation of the passivation film are continuously performed in the same reaction chamber.

This method prevents oxidization and contamination on the surface of the grown layers and involves simplified manufacturing processes compared with the prior art that must use separate apparatuses to grow the layers and form the passivation film.

The present invention also provides a method of manufacturing a compound semiconductor device, including the steps of growing a plurality of layers on a substrate, forming a passivation film on top of the grown layers, and annealing the substrate with the grown layers and passivation film. The growth of the layers, the formation of the passivation film, and the annealing of the substrate with the layers and thin film are continuously performed in the same reaction chamber.

This method forms and anneals the layers and thin film on the substrate in the same reaction chamber, to further simplify the manufacturing processes. This method prevents oxidization and contamination on the surface of the grown layers and more activates p-type impurities added among the layers, to provide the device with good conductivity.

DETAILED DESCRIPTION OF THE EMBODIMENTS

Figure 1:
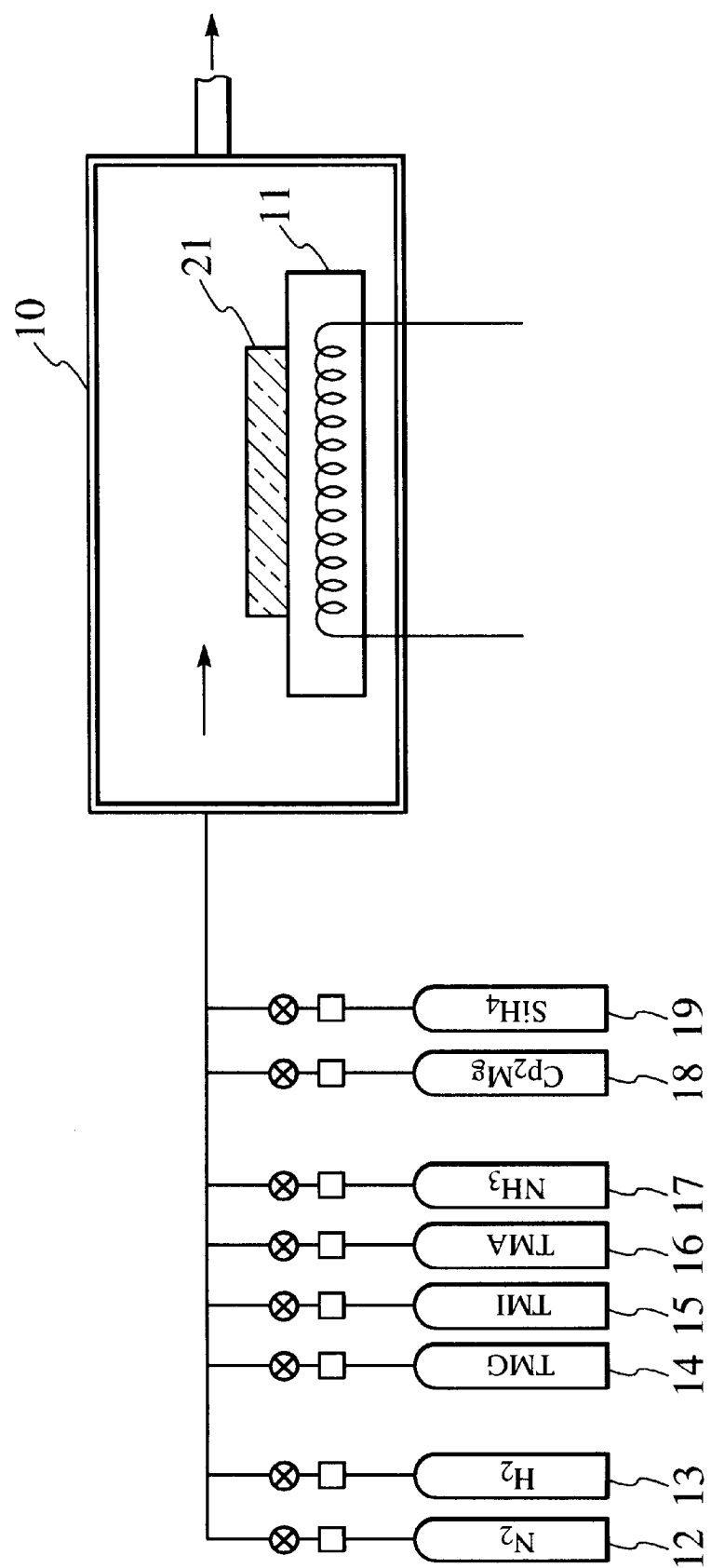
FIG. 1 roughly shows an apparatus for manufacturing compound semiconductor devices according to first to third embodiments of the present invention.

The embodiments of the present invention will be explained with reference to the drawings.

A compound semiconductor device and a method of manufacturing the same according to the first embodiment of the present invention will be explained with reference to FIGS. 1 to 3 in which FIG. 1 roughly shows an apparatus for manufacturing the compound semiconductor device of the first embodiment.

The apparatus has an air tight reaction chamber 10 that has a supply port and an exhaust port. The exhaust port is preferably connected to a vacuum pump (not shown). The reaction chamber 10 has a susceptor 11 that incorporates a heater and supports a substrate 21.

The supply port is connected to supply sources 12 to 19. The supply sources 12 and 13 supply carrier gases of $N_2$ and $H_2$, respectively. The supply sources 14 to 17 supply layer growing material gasses of trimethylgallium (TMG), trimethylindium (TMI), trimethylaluminium (TMA), and $NH_3$, respectively. The supply sources 18 and 19 supply doping gases of bis-cyclopentadienyl magnesium ($Cp_2Mg$) and $SiH_4$, respectively. Each of the supply sources 12 to 19 is connected to a common pipe through a mass flow meter and a valve for adjusting a flow rate of the gas.

In the first embodiment, the substrate 21 is made of sapphire, and an MOCVD method is used for epitaxially growing gallium-nitride-based layers on the substrate 21 and form an SiNx film thereon. The SiNx film is a dielectric thin film and serves as a passivation film. A method of the first embodiment of forming the layers and thin film on the substrate 21 will be explained with reference to FIGS. 2A to 2G.

The sapphire substrate 21 (FIG. 2A) is placed on the susceptor 11 in the reaction chamber 10. The carrier gases of $N_2$ and $H_2$ are supplied to the reaction chamber 10, and the substrate 21 is heated to a temperature in the range of 800° C. to 1300° C. While layers are grown on the substrate 21, the carrier gasses of $N_2$ and $H_2$ are continuously supplied to the reaction chamber 10. On the other hand, the material gases (reactive gases) and doping gases are properly supplied and stopped depending on layers to be formed. The layers and passivation film are grown at atmospheric pressure.

Figure 2A:
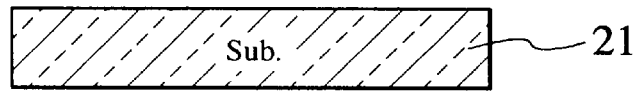
FIGS. 2A to 2G are sectional views showing a sequence of steps of manufacturing any one of compound semiconductor devices according to the first to sixth embodiments of the present invention.
Figure 2B:
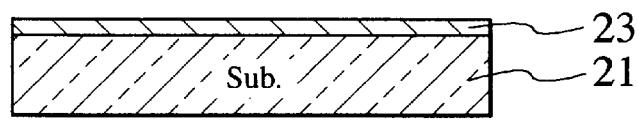
Figure 2C:
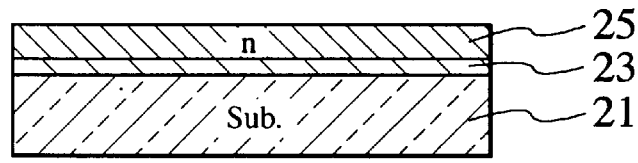
Figure 2D:
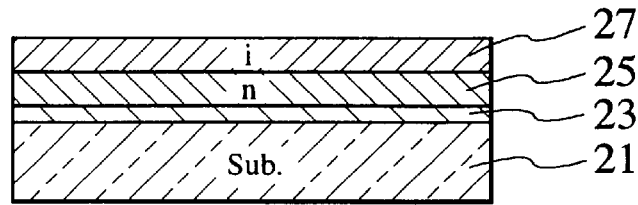
Figure 3:
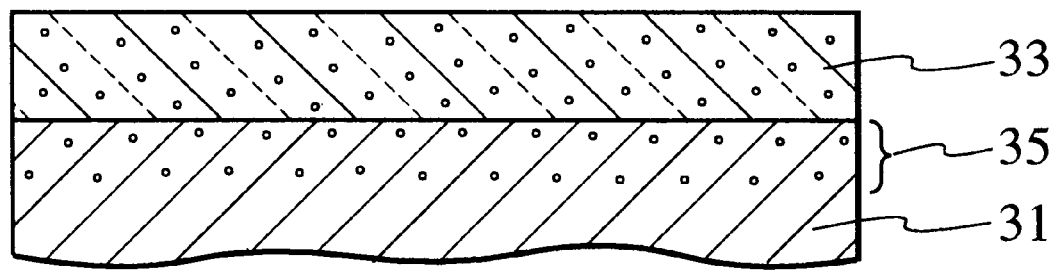
FIG. 3 is a sectional view showing part of the compound semiconductor device of the third embodiment.

First, the reactive gases of TMG and $NH_3$ are supplied to form a GaN buffer layer 23 (FIG. 2B). The reactive gases TMG and $NH_3$ and the n-type doping gas of $SiH_4$ are supplied to form an n-GaN layer 25 (FIG. 2C). The reactive gases of TMG, TMI, and $NH_3$ are supplied to form a non-doped InGaN active layer 27 (FIG. 2D).

Figure 2E:
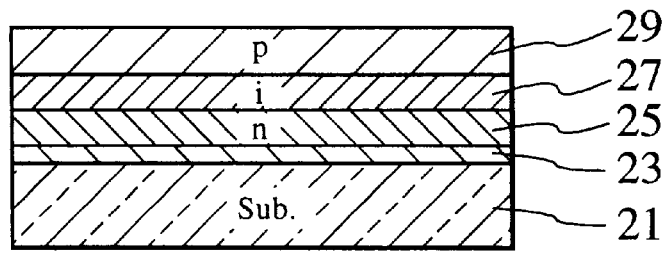
Figure 2F:
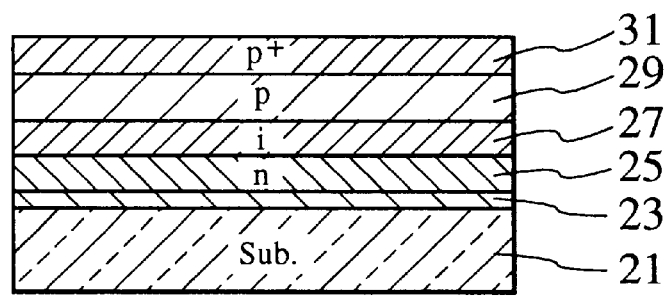

The reactive gases of TMA, TMG, $NH_3$ and the p-type doping gas of $Cp_2Mg$ are supplied to form a p-AlGaN layer 29 (FIG. 2E). Then, the reactive gases of TMG and $NH_3$ are supplied and the flow rate of the doping gas of $Cp_2Mg$ is increased to form a $p^+$-GaN contact layer 31 (FIG. 2F).

Once the top layer 31 is formed, the reactive gas of TMG and the doping gas of $Cp_2Mg$ are stopped, and the n-type doping gas of $SiH_4$ is supplied.

More precisely, the substrate 21 having the layers 23 to 31 is kept in the reaction chamber 10 at the temperature in the range of 800° C. to 1300° C. where the layers 23 to 31 have been grown. The carrier gases of $N_2$ and $H_2$ and the reactive gas of $NH_3$ are continuously supplied to the reaction chamber 10, and the supply of the doping gas of $SiH_4$ is started. As a result, $SiH_4$ reacts with $NH_3$, to form an SiNx dielectric thin film 33 (FIG. 2G) on the top layer 31.

Conditions of forming the SiNx film 33 are equal to standard SiNx film forming conditions of a thermal CVD method. The thickness of the SiNx film 33 is preferably in the range of 500A to 5000A that hardly causes pinholes or internal stress. Thereafter, the substrate 21 is rapidly or slowly cooled to a sufficiently low temperature and is taken out of the reaction chamber 10.

In this way, the first embodiment successively carries out the growth of the layers 23 to 31 and the formation of the passivation film 33 in the same reaction chamber 10. As a result, the top of the layers 23 to 31 is not exposed to open air before the SiNx passivation film 33 is formed thereon. This results in keeping the top of the layers 23 to 31 clean and improving the properties of the compound semiconductor device thus formed. Unlike the prior art that must employ separate apparatuses for growing layers and forming a passivation film, in the first embodiment a single apparatus is used to form these layers and film. Accordingly, the first embodiment involves a reduced number of heating, cooling, and transporting processes on a substrate, thereby simply and efficiently manufacturing compound semiconductor devices.

The compound semiconductor devices manufactured according to the first embodiment are characterized in that an interface between the passivation film and the grown layers includes no oxidized or contaminated layer because the top of the grown layers is not exposed to open air, and in that an N-rich SiNx film may be formed in the vicinity of the interface because there is a slight delay at the start of the formation of the SiNx film, between the opening of the valve for supplying the $SiH_4$ gas and the arrival of the same gas to the substrate 21.

The second embodiment of the present invention will be explained. Similar to the first embodiment, the second embodiment employs a sapphire substrate, epitaxially grows gallium-nitride-based layers on the substrate according to the MOCVD method, and forms a dielectric SiNx thin film serving as a passivation film on the grown layers.

In the second embodiment, the same manufacturing apparatus of FIG. 1 is used. The second embodiment differs from the first embodiment in that it carries out an annealing process after the formation of the SiNx film.

Similar to the first embodiment, the sapphire substrate 21 is set in the reaction chamber 10. The TMG, TMI, TMA, NH$_3$, Cp$_2$Mg, and SiH$_4$ gases are used to grow a GaN buffer layer 23, an n-GaN layer 25, an InGaN active layer 27, a p-AlGaN layer 29, and a p$^+$-GaN contact layer 31 as shown in FIGS. 2A to 2F.

Figure 2G:
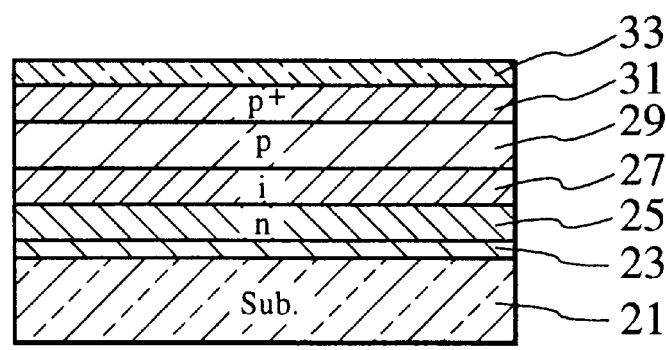

The substrate 21 with the layers 23 to 31 is kept in the reaction chamber 10 at a temperature in the range of 800° C. to 1300° C. The carrier gases of N$_2$ and H$_2$ and the reactive gas NH$_3$ are continuously supplied to the reaction chamber 10, and the supply of the SiH$_4$ gas is started, to form an SiNx film 33 on the layer 31 as shown in FIG. 2G.

After the SiNx film 33 is completely formed, the reactive gases of NH$_3$ and SiH$_4$ and the carrier gas of H$_2$ are stopped. Namely, only the carrier gas of N$_2$ is supplied to the reaction chamber 10.

The substrate 21 with the layers 23 to 31 and film 33 is kept in the reaction chamber 10. The substrate is kept at the SiNx film forming temperature or at a temperature in the range of 300° C. to 1300° C., preferably in the range of 700° C. to 1000° C. for a predetermined period, to carry out a heat treatment. The heat treatment conditions are equal to conventional annealing conditions that are achieved in a separate annealing apparatus. The heat treatment activates p-type impurities added among the grown layers more and improves the p-type property of the compound semiconductor device thus formed.

After the heat treatment, i.e., annealing, the substrate 21 is cooled and is taken out of the reaction chamber 10. At this time, the product is complete with the passivation film and annealed. The second embodiment, therefore, greatly simplifies the manufacturing processes of compound semiconductor devices.

It is not necessary to fix the annealing temperature. It may be changed overtime. For example, the substrate 21 may steadily be cooled in the range of 300° C. to 1300° C., preferably in the range of 700° C. to 1300° C., to provide the same annealing effect.

The third embodiment of the present invention will be explained. Similar to the first and second embodiments, in the third embodiment, gallium-nitride-based layers are epitaxially grown on a sapphire substrate by MOCVD method. Then, the third embodiment forms an SiNx film serving as a passivation film on the grown layers. In the third embodiment the manufacturing apparatus of FIG. 1 is used. The third embodiment differs from the first and second embodiments in that p-type impurities are doped to the passivation film while forming the film.

Similar to the first and second embodiments, the TMG, TMI, TMA, NH$_3$, Cp$_2$Mg, and SiH$_4$ gases are used to grow a GaN buffer layer 23, an n-GaN layer 25, an InGaN active layer 27, a P-AlGaN layer 29, and a p$^+$-GaN contact layer 31 on the sapphire substrate 21 as shown in FIGS. 2A to 2F.

Continuously, a dielectric SiNx thin film 33 is formed on the layers 23 to 31 in the same reaction chamber 10. At this time, the gases of NH$_3$ and SiH$_4$ needed for forming the SiNx film 33 as well as the p-type dopant source Cp$_2$Mg are simultaneously supplied to the reaction chamber 10. As a result, a p-type dopant of Mg is added to the SiNx film 33.

After the formation of the Mg-doped SiNx film 33, the substrate 21 is heat-treated. As shown in FIG. 3, Mg is thermally diffused into a region 35 in the vicinity of the surface of the p$^+$-GaN contact layer 31, to increase the density of Mg in the region 35. If the substrate 21 is maintained at a temperature in the range of 800° C. to 1300° C. where the layers 23 to 31 have been grown or the SiNx film has been formed, for a predetermined period, the impurities will diffuse, and at the same time, an annealing effect will be obtained. This heat treatment is not needed to be a separate process. If the substrate heated to the range of 1300° C. to 800° C. is gradually cooled, Mg will sufficiently diffuse due to heat during the cooling period.

The compound semiconductor device thus formed has a high-density p-type impurity diffusion region in the p$^+$-GaN contact layer 31. The high-density impurities realize a good electrical contact between the contact layer 31 and an electrode to be arranged on the contact layer 31.

If the top layer 31 is made of n-type semiconductor, n-type dopant will be added to the passivation film 33.

The fourth embodiment of the present invention will be explained with reference to FIGS. 2A to 4. Unlike the first to third embodiments which use a sapphire substrate and form an SiNx passivation film, in the fourth embodiment, a silicon (Si) substrate is used and an SiO$_2$ passivation film is formed.

Figure 4:
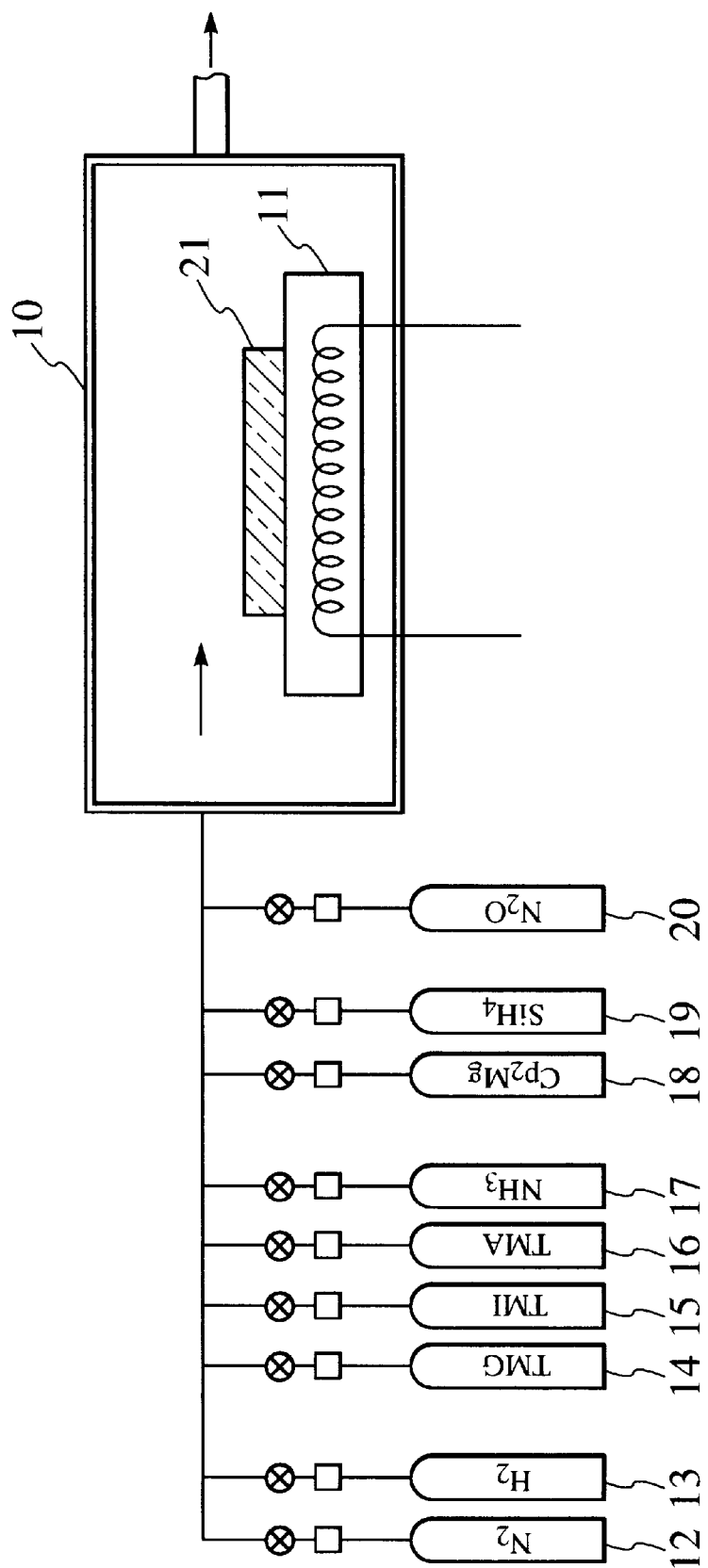
FIG. 4 roughly shows an apparatus for manufacturing the compound semiconductor devices of the fourth and fifth embodiments.

FIG. 4 shows a manufacturing apparatus used for the fourth embodiment. This apparatus is basically the same as that of FIG. 1 and additionally has a supply source 20 for supplying a gas of N$_2$O to form an SiO$_2$ film.

An Si substrate 21 is set on a susceptor 11 in a reaction chamber 10. TMG, TMI, TMA, NH$_3$, Cp$_2$Mg, and SiH$_4$ material gases are used to grow a GaN buffer layer 23, an n-GaN layer 25, an InGaN active layer 27, a p-AlGaN layer 29, and a p$^+$-GaN contact layer 31 as shown in FIGS. 2A to 2F. A sequence of growing these layers may be the same as that of the first embodiment.

After the layers 23 to 31 are completely grown, the carrier gas of H$_2$, the reaction gases of TMG and NH$_3$, and the doping gas of Cp$_2$Mg are stopped. Namely, only the carrier gas of N$_2$ is supplied to the reaction chamber 10. The temperature of the substrate 21 is dropped to an SiO$_2$ growing temperature in the range of 350° C. to 500° C. Once the substrate temperature reaches the range, the N$_2$O and SiH$_4$ gases are supplied to form an SiO$_2$ film 33 on the p$^+$-GaN contact layer 31 as shown in FIG. 2G. Conditions of forming the SiO$_2$ film 33 may be equal to standard film forming conditions of a thermal CVD method.

The thickness of the SiO2 film may be in the range of 500A to 5000A to cause no pinholes or internal stress. The substrate 21 is rapidly or slowly cooled. Alternatively, similar to the second embodiment, an annealing process may be carried out after the formation of the SiO2 film, at the SiO$_2$ growing temperature, or preferably, at a temperature in the range of 700° C. to 1000° C. in an N$_2$ atmosphere.

The fourth embodiment provides a compound semiconductor device having good properties with simple processes, like the first and second embodiments.

In the fourth embodiment, only for a short time, at a high temperature, the surface of the layers 23 to 31 is exposed to the inside of the reaction chamber 10 without the V-group gas of NH$_3$. Then, the N$_2$O gas is supplied to the reaction chamber 10. Accordingly, V-group elements may escape from the top of the layers 23 to 31, and the vacancies that V-group-element-escaped may be filled with O and N, to form a very thin layer of GaOxNy between the p$^+$-GaN contact layer 31 and the SiO$_2$ film 33. If the SiH$_4$ gas is supplied behind the N$_2$O gas, there will be a region that shows a change from O-rich composition to Si-rich composition in the thickness direction of the SiO$_2$ film.

The fifth embodiment of the present invention will be explained with reference to FIGS. 2A to 4. Unlike the first to third embodiments that use a sapphire substrate and form an SiNx passivation film, in the fifth embodiment, a silicon carbide (SiC) substrate is used and a silicon oxynitride (SiON) passivation film is formed.

The fifth embodiment employs the manufacturing apparatus of FIG. 4. Similar to the first embodiment, an Si substrate 21 is set on the susceptor 11 in the reaction chamber 10. The TMG, TMI, TMA, $NH_3$, $Cp_2MG$, and $SiH_4$ material gases are supplied to the reaction chamber 10, to grow a GaN buffer layer 23, an n-GaN layer 25, an InGaN active layer 27, a p-AlGaN layer 29, and a $p^+$-GaN contact layer 31 as shown in FIGS. 2A to 2F. Conditions of growing these layers are the same as those of the first embodiment.

After the layers 23 to 31 are completely grown, the carrier gas of $H_2$, reaction gas of TMG, and doping gas of $Cp_2Mg$ are stopped. At this time, only the carrier gas of $N_2$ and reactive gas of $NH_3$ are supplied to the reaction chamber 10. The temperature of the substrate 21 is dropped to an SiON film growing temperature in the range of 500° C. to 1200° C. Once the substrate temperature reaches the range, the gases of $N_2O$ and $SiH_4$ are supplied to the reaction chamber 10, to form an SiON film 33 on the $p^+$-GaN contact layer 31 as shown in FIG. 2G. Conditions of forming the SiON forming the SiON film 33 are equal to standard film forming conditions of a thermal CVD method.

The thickness of the SiON film 33 is in the range of 500A to 5000A to cause no pinholes or internal stress. The substrate 21 is rapidly or slowly cooled. Alternatively, like the second embodiment, an annealing process may be performed after the formation of the SiON film 33. The substrate can be annealed at the SiON film forming temperature, or preferably, at a temperature in the range of 700° C. to 1000° C. in an $N_2$ atmosphere.

The fifth embodiment provides a compound semiconductor device having good properties with a simple process, like the first and second embodiments.

The SiON film of the fifth embodiment may include a region that shows a change from O-rich composition to Si-rich composition in the thickness direction of the SiON film, if the supply of $SiH_4$ is behind the supply of $N_2O$.

The sixth embodiment of the present invention will be explained with reference to FIGS. 2A to 5. In this embodiment a gallium arsenide (GaAs) substrate is used and a SiON passivation film is grown.

GaAs is III-V-group semiconductor and the escape of V-group elements is easy to cause. Therefor, GaAs is hardly usable as a substrate for the MOCVD method that involves a high-temperature heating process. Accordingly, unlike the first to fifth embodiments, in the sixth embodiment, by using GS-MBE (gas source molecular beam epitaxy) method layers are grown and the passivation film is formed.

Figure 5:
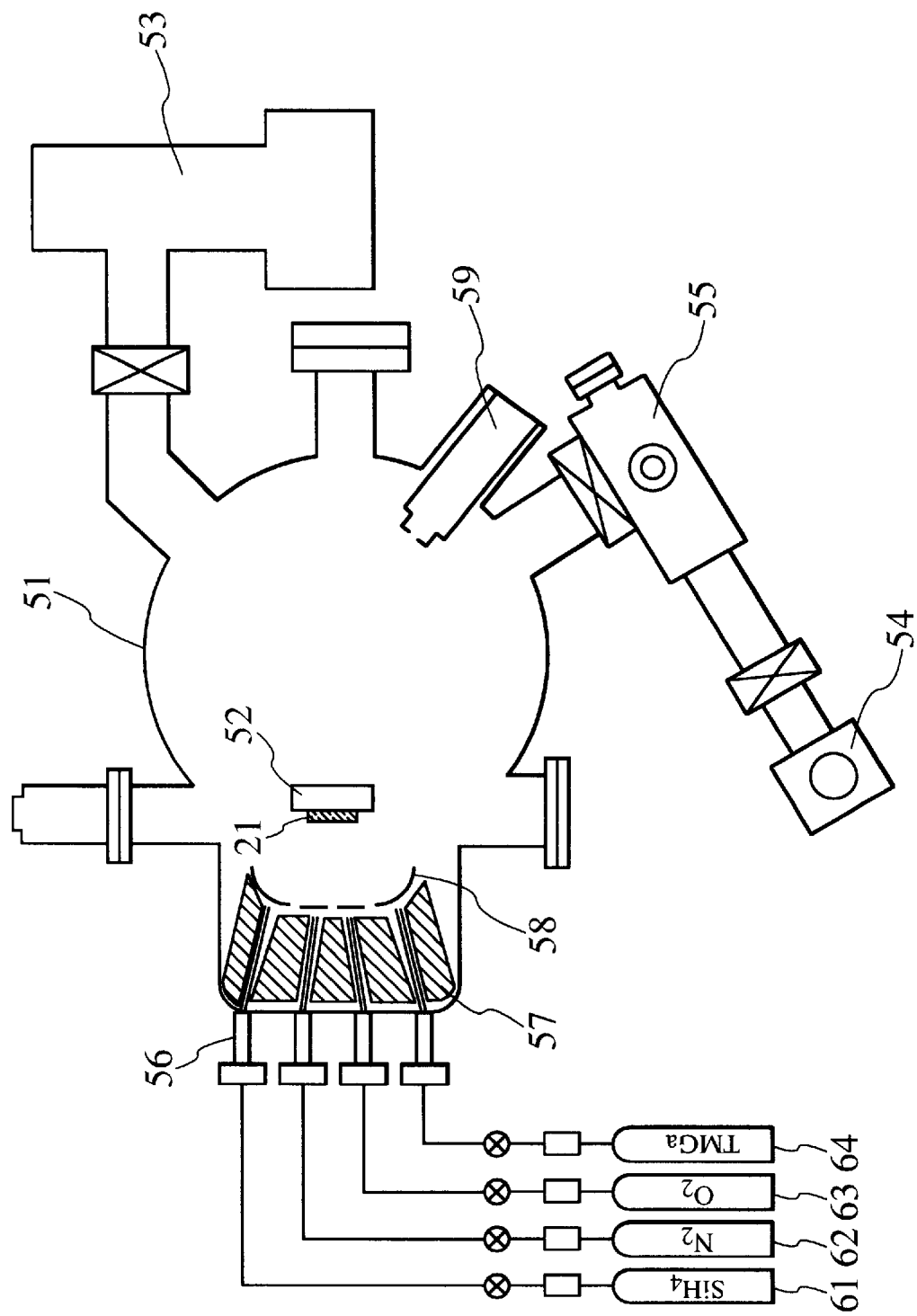
FIG. 5 roughly shows an apparatus for manufacturing the compound semiconductor device of the sixth embodiment.
Figure 6:
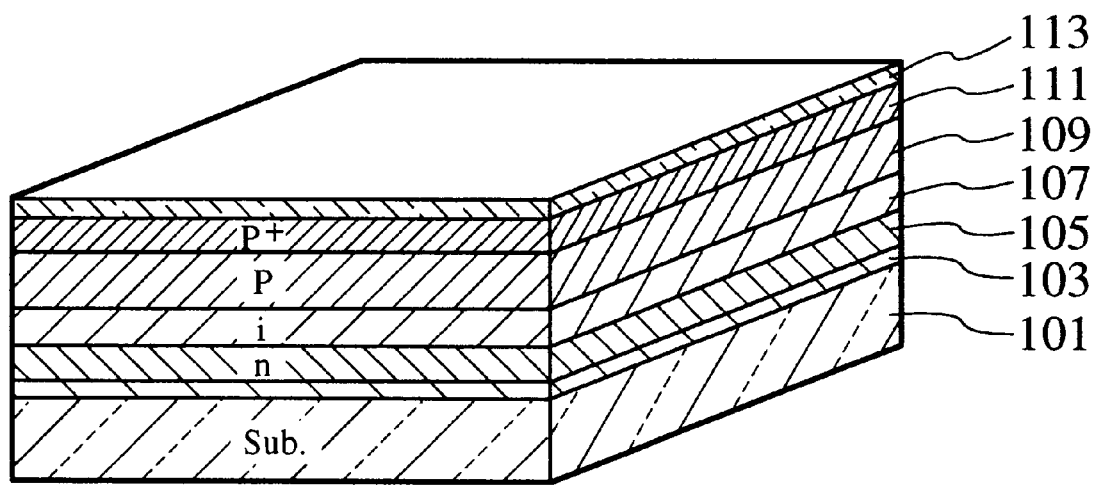
FIG. 6 is a sectional view showing a compound semiconductor device according to the prior art.

FIG. 5 roughly shows a manufacturing apparatus used for the sixth embodiment. The apparatus has a reaction chamber 51 that is capable of maintaining an ultra-high vacuum. Around the reaction chamber 51, there are arranged ultra-high vacuum pump 53 for forming an ultra-high vacuum in the reaction chamber 51, and a load lock chamber 55 connected to a turbo molecular pump 54. The load lock chamber 55 maintains the ultra-high vacuum in the reaction chamber 51 while a substrate is being moved into or from the reaction chamber 51.

To grow epitaxial layers, a $SiH_4$ gas supply source 61, an $N_2$ gas supply source 62, an $O_2$ gas supply source 63, and a TMGa gas supply source 64 are connected to the reaction chamber 51. Each gas from these supply sources is passed through a gas cell 56, enters the reaction chamber 51, and is evaporated through a thin pipe in a liquid nitrogen shroud 57. Since the inside of the reaction chamber 51 maintains an ultra-high vacuum, evaporated molecules from the thin pipes form uniformly oriented molecular beams. The evaporation sources are selected by opening and closing shutters 58 or by selectively emitting a beam from a laser source 59.

The apparatus also has various analyzers to analyze a growing layer or film and control the growth of a layer or film on an atomic level.

The substrate 21 is kept at a relatively low temperature, the inside of the reaction chamber 51 is set to an ultra-high vacuum of about $10^{-8}$ Pas, and gases to be evaporated are sequentially selected, to grow a GaN buffer layer 23, an n-GaN layer 25, an InGaN active layer 27, a p-AlGaN layer 29, and a $p^+$-GaN contact layer 31 as shown in FIGS. 2A to 2F. For example, the GaN buffer layer 23 is formed by simultaneously evaporating $N_2$ and TMGa. The other layers are sequentially grown similarly.

After the layers 23 to 31 are completely grown, the GaAs substrate 21 with the layers 23 to 31 is kept in the 35 reaction chamber 51, and evaporation sources of $O_2$, $N_2$, and $SiH_4$ are selected to form a SiON passivation film 33, which is controlled on an atomic level, on the top layer 31. Instead of SiON, the passivation film 33 may be made of $SiO_2$, SiNx, etc.

In this way, the layers 23 to 31 and passivation film 33 are successively formed in the same reaction chamber 51, to produce a compound semiconductor device while keeping the top of the layers clean. The sixth embodiment employs the GS-MBE method that is capable of controlling the growth of layers and films on an atomic level, and therefore, it is assumed that the product of the sixth embodiment has a steep composition change in each interface among the layers and films.

Although the present invention has been explained with reference to the embodiments, the present invention is not limited to these embodiments.

For example, layers grown on a substrate may be made of other materials. For example, materials expressed as $In_xAl_yGa_{(1-x-y)}N(0 \leq x \leq 1, 0 \leq Y \leq 1)$ such as AlN, p-AlN, p-InGaN, and p-InGaAlN may be used to provide the same effect of the present invention.

Although each embodiment relates to growing layers for a standard blue light emitting diode, this does not limit the present invention. For example, layers may be grown for a semiconductor laser.

Although in the first to sixth embodiments, $SiH_4$ is used for a reactive gas to form the passivation film, a higher-order silane gas such as a disilane ($Si_2H_6$) gas may be used for the same purpose.

In the third embodiment, $Cp_2Mg$ is used for dopant source to add Mg into the passivation film. Instead, dimethylzinc (DMZn) may be used as a dopant source to add Zn into the passivation film.

As explained above, in the present invention, epitaxial layers are grown in a reaction chamber, and in the same reaction chamber, continuously a passivation film is formed on the epitaxial layers to manufacture a compound semiconductor device. Accordingly, the device is complete with the passivation film covering the top of the epitaxial layers when it is taken out of the reaction chamber. The device, therefore, has no surface defects and possesses good properties. The present invention needs no separate processes nor separate apparatuses for forming the passivation film, thereby greatly simplifying the manufacturing processes of compound semiconductor devices and reducing the cost thereof.

What is claimed is:

1. A method of manufacturing a compound semiconductor device, comprising the steps of:

growing layers on a substrate, wherein the grown layers include at least one layer expressed as $In_xAl_yGa_{(1-x-y)}N (0 \leq x \leq 1, 0 \leq y \leq 1)$; and forming a passivation film on the grown layers, wherein the passivation film is one of a dielectric thin film and an insulating thin film formed from gas containing silicon (Si) and nitrogen (N) or gas containing silicon (Si) and oxygen (O)

the growth of the layers and the formation of the passivation film being continuously performed in the same reaction chamber.

2. The method of manufacturing a compound semiconductor device as claimed in claim 1, wherein the passivation film forming step includes the step of adding p- or n-type impurities to the passivation film.

3. The method of manufacturing a compound semiconductor device as claimed in claim 2, wherein the p-type impurities are Mg or Zn impurities.

4. The method of manufacturing a compound semiconductor device as claimed in claim 2, further comprising the step of:

heat-treating the passivation film in the same reaction chamber, to diffuse the impurities added to the passivation film into the top part of the grown layers.

5. A method of manufacturing a compound semiconductor device, comprising the steps of:

growing layers on a substrate, wherein the grown layers include at least one layer expressed as $In_xAl_yGa_{(1-x-y)}N (0 \leq x \leq 1, 0 \leq y \leq 1)$;

forming a passivation film on the grown layers, wherein the passivation film is one of a dielectric thin film and an insulating thin film formed from gas containing silicon (Si) and nitrogen (N) or gas containing silicon (Si) and oxygen (O); and annealing the substrate with the layers and passivation film, the growth of the layers, the formation of the passivation film, and the annealing of the substrate being continuously performed in the same reaction chamber.

6. The method of manufacturing a compound semiconductor device as claimed in claim 5, wherein the annealing step includes holding the substrate in an inert gas at a temperature in the range of 1300° C. to 300° C., or includes gradually cooling the substrate in an inert gas in the temperature range of 1300° C. to 300° C.

7. The method of manufacturing a compound semiconductor device as claimed in any one of claims 1 and 5; wherein:

the gas containing Si is one of a monosilane ($SiH_4$) gas and a disilane ($Si_2H_4$) gas;

the gas containing O is a nitrogen dioxide ($N_2O$) gas; and the gas containing N is an ammonia ($NH_3$) gas.

* * * * *